United States Patent
Tham et al.

(10) Patent No.: US 10,551,262 B2
(45) Date of Patent: Feb. 4, 2020

(54) COMPONENT ARRANGEMENT WITH AT LEAST TWO COMPONENTS AND METHOD FOR PRODUCING A COMPONENT ARRANGEMENT

(71) Applicant: Endress + Hauser GmbH + Co. KG, Maulburg (DE)

(72) Inventors: Anh Tuan Tham, Berlin (DE); Benjamin Lemke, Berlin (DE); Jorg Brauer, Chemnitz (DE); Jan Besser, Hoyerswerda (DE); Maik Wiemer, Limbach-Oberfrohna (DE); Thomas Gessner, Chemnitz (DE)

(73) Assignee: ENDRESS+HAUSER SE+CO.KG, Maulburg (DE)

( * ) Notice: Subject to any disclaimer, the term of this patent is extended or adjusted under 35 U.S.C. 154(b) by 163 days.

(21) Appl. No.: 15/120,596

(22) PCT Filed: Jan. 16, 2015

(86) PCT No.: PCT/EP2015/050790
§ 371 (c)(1),
(2) Date: Aug. 22, 2016

(87) PCT Pub. No.: WO2015/128112
PCT Pub. Date: Sep. 3, 2015

(65) Prior Publication Data
US 2017/0010167 A1    Jan. 12, 2017

(30) Foreign Application Priority Data
Feb. 28, 2014   (DE) ........................ 10 2014 102 717

(51) Int. Cl.
*G01L 9/00* (2006.01)
*B23K 20/16* (2006.01)
(Continued)

(52) U.S. Cl.
CPC .......... *G01L 9/0044* (2013.01); *B23K 20/165* (2013.01); *B81B 3/0021* (2013.01);
(Continued)

(58) Field of Classification Search
CPC ..................................................... B23K 20/165
See application file for complete search history.

(56) References Cited

U.S. PATENT DOCUMENTS

| 6,534,194 B2 | 3/2003 | Weihs |
| 7,975,902 B2 | 7/2011 | Wilden |

(Continued)

FOREIGN PATENT DOCUMENTS

| CN | 1100198 A | 3/1995 |
| CN | 1817639 A | 8/2006 |

(Continued)

OTHER PUBLICATIONS

J. Braeuer, J. Besser, M. Wiemer and T. Gessner, "Room-Temperature Reactive Bonding by using Nano Scale Multilayer Systems", 16th International Solid-State Sensors, Actuators and Microsystems Conference (TRANSDUCERS '11), Beijing, China, Jun. 5-9, 2011.

(Continued)

*Primary Examiner* — Thien F Tran
(74) *Attorney, Agent, or Firm* — Bacon & Thomas, PLLC

(57) ABSTRACT

A component arrangement comprising a first component which has a first joining surface and a second component which has a second joining surface. The first joining surface is connected to the second joining surface using an integrated reactive material system. The integrated reactive material system comprises at least one coating of at least one of the joining surfaces, and the integrated reactive material system comprises an activation region on one surface. The integrated activation region is arranged outside of the joined (Continued)

together regions of the first or second joining surfaces and adjoins the regions which are joined together.

6 Claims, 3 Drawing Sheets

(51) Int. Cl.
*B81B 3/00* (2006.01)
*B81C 1/00* (2006.01)
*B23K 101/40* (2006.01)

(52) U.S. Cl.
CPC ...... *B81C 1/00269* (2013.01); *B23K 2101/40* (2018.08); *B81B 2201/0264* (2013.01); *B81B 2203/0127* (2013.01); *B81C 2203/037* (2013.01)

(56) References Cited

U.S. PATENT DOCUMENTS

| | | | |
|---|---|---|---|
| 8,227,297 B2 | 7/2012 | Naundorf | |
| 8,299,630 B2 | 10/2012 | Braeuer | |
| 2001/0038029 A1 | 11/2001 | Weihs | |
| 2005/0051607 A1* | 3/2005 | Wang | B23K 1/0006 228/246 |
| 2005/0082343 A1* | 4/2005 | Wang | B23K 1/0006 228/115 |
| 2006/0220223 A1 | 10/2006 | Lu | |
| 2011/0024416 A1 | 2/2011 | Xun | |
| 2011/0299800 A1 | 12/2011 | Seufert | |

FOREIGN PATENT DOCUMENTS

| | | |
|---|---|---|
| CN | 18 59997 A | 11/2006 |
| CN | 102017110 A | 4/2011 |
| CN | 102239342 A | 11/2011 |
| DE | 102007020389 A1 | 11/2008 |
| DE | 102008060116 A1 | 6/2010 |
| DE | 102009006822 A1 | 9/2010 |
| DE | 102009015502 A1 | 10/2010 |
| WO | 2009003130 A2 | 12/2008 |
| WO | 2009133105 A1 | 11/2009 |
| WO | 2015036908 A2 | 3/2015 |

OTHER PUBLICATIONS

B. Boettge, Joerg Braeuer, M. Wiemer, M. Petzold, J. Bagdahn and T. Gessner, "Fabrication and Characterization of Reactive Nanoscale Multilayer Systems for Low-Temperature Bonding in Microsystem Technology", J. Micromech, vol. 20, Jun. 1, 2010.

German Search Report, German Patent Office, Munich, DE, dated Mar. 11, 2014.

International Search Report, EPO, The Netherlands, dated Apr. 20, 2015.

English Translation of the International Preliminary Report on Patentability, WIPO, Geneva, CH, dated Sep. 15, 2016.

Office Action dated Sep. 19, 2018, issued in corresponding Chinese application No. 2015 80011048.5.

* cited by examiner

COMPONENT ARRANGEMENT WITH AT LEAST TWO COMPONENTS AND METHOD FOR PRODUCING A COMPONENT ARRANGEMENT

TECHNICAL FIELD

The present invention relates to a component arrangement with at least two components, which are joined together, and a method for producing such a component arrangement by joining two components.

BACKGROUND DISSCUSION

In this respect, the requirements for the joining connection are many and varied. For example, temperature-sensitive polymers, organic substances and/or materials with different thermal expansion coefficients, and components with temperature-sensitive materials must be connected to one another. In many applications, especially, in industrial process measurement technology, it is required that joining connections be hermetically sealed. This is significant in that adhesive connections are largely ruled out. Welded connections and soldered connections are indeed hermetically sealed, but are problematic, in that their production thermally stresses the joining partners, especially if the surfaces to be joined between the joining partners are to be brought to the melting temperature of the soldering material by heating the joining partners.

For this reason, reactive material systems are basically attractive for connecting temperature-sensitive joining partners, in particular. Reactive material systems allow even propagating exothermic reactions that are already used in other areas of application for joining components. In this respect, there are basically two variants. On the one hand, thermal reactions in powder mixtures are used to fuse substances; on the other hand, even propagating reactions are used in nanoscale multilayer systems in the form of foils, in order to fuse solder layers and thus create a joining connection. The reactive material systems with nanoscale multilayer systems in the form of foils are offered, for example, by the Indium Corp. under the designation, Nano-Foil®. For microsystems technology applications, it is, however, difficult to activate the joining process in a controlled manner and to let it take place in a sufficiently precisely localized manner with defined energy density. In addition, such foils are difficult to manufacture and, therefore, suitable only with restrictions, especially for applications in microsystems technology.

SUMMARY OF THE INVENTION

The object of the present invention is, therefore, to find a remedy.

The object is achieved in accordance with the invention by the component arrangement which comprises a first component, which has a first joining surface; and a second component, which has a second joining surface, wherein the first joining surface is connected to the second joining surface using an integrated reactive material system, wherein the integrated reactive material system comprises at least one coating of at least one of the joining surfaces, wherein the integrated reactive material system comprises an activation region on one surface, wherein the activation region is arranged outside of first or second joining surface regions which are joined together and adjoins the regions which are joined together.

An integrated reactive material system contains at least two components, the mixing of which can lead to an exothermic reaction that self-propagates after activation. The two components are provided in a plurality of alternating layers, with a thickness of a few nanometers each. After local activation, neighboring atoms from the alternating layers are excited so as to form intermetallic phases, wherein diffusion of the components occurs between the layers. The heat of reaction is conveyed along the individual layers. In order for a self-sustaining reaction to occur, the heat of reaction must be released at least at such a rate that an activation temperature can be maintained, even though the heat is conducted away by heat transfer. For this purpose, the standard enthalpy of formation of the reactants should, for example, be not less than approximately −30 kJ/mol atom, especially, not less than −40 kJ/mol atom, and preferably not less than 50 kJ/mol atom.

The provision of the integrated reactive material system in the form of a coating can take place, especially, by physical vapor deposition (PVD). This offers significant advantages compared to the provision of integrated reactive material systems in the form of free-standing foils known from the prior art. Suitable integrated reactive material systems comprise, for example, alternating layers of nickel and aluminum or titanium and aluminum.

In a further development of the invention, the integrated reactive material system comprises alternating layers of one of the following material combinations.

Al, in combination with one of the following materials $CuO_x$, $Fe_2O_3$, Ni, Pd, Pt, and Zr; or Ti, in combination with B, or Si; or Zr, Ni, or Pd, in combination with Si; or Pd or Pt, in combination with Sn or Zn.

In a further development of the invention, the integrated material system comprises three or more material partners—for example, by combination of the materials above.

According to a further development of the invention, the thickness of the individual alternating layers is not less than 10 nm and not more than 1000 nm, especially, not more than 100 nm. According to a further development of the invention, the total thickness of the integrated reactive material system is, for example, not less than 1 μm and not more than 40 μm, especially, not more than 20 μm.

After initiating the reaction between the components of the integrated reactive material system, in order to join the components, the released heat of reaction leads to interdiffusion, fusing surrounding soft or hard solder layers, and thus to the creation of bonded connections. This is preceded by an appropriate coating of the joining partners with appropriate connection layers.

In special cases, solder or hard solder layers must not be fused, but "pure" metals (e.g., Al or Ti) can be fused, in principle.

Owing to the reaction characteristics, such as very fast heating and cooling rates and high reaction rates, the heat input takes place only in direct proximity to the exothermic reaction. Another principal advantage of such a method consists in the released amount of heat being able to be limited and controlled by means of the amount of the reacting layer material, i.e., the number and thickness of the layers, and in the temperature increase required for the thermally induced formation of the connection occurring for only a very short period of time. In this way, the reaction can be controlled, such that thermal damage to temperature-sensitive joining partners is prevented.

In a further development of the invention, a first of the joining surfaces comprises a coating with the integrated reactive material system, wherein a second of the joining surfaces, which is connected to the first joining surface, comprises a wetting layer, which may, especially, contain gold.

In a further development of the invention, the surface that comprises the activation region is tilted with respect to a plane, which is defined by the connected regions of the joining surfaces, at an angle α, which is not less than 45°, especially, not less than 60°, preferably not less than 80°, and particularly preferably, a right angle.

In a further development of the invention, the surface that comprises the activation region is arranged in a plane, which is defined by the connected regions of the joining surfaces.

In a further development of the invention, at least one of the components contains glass, ceramics, a semiconductor, especially silicon or GaAs, a metal, or a plastic as a material.

In this way, according to the invention, different materials or components, such as silicon (chip-to-chip [Si—Si], chip-to-wafer [Si—Si], chip-to-board [Si-FR4]), can be connected with each other. For the glasses, borosilicate and Foturan, especially, are suitable for implementing the invention. The ceramics can, especially, be provided in the form of thin and thick film technologies. Metals are present, for example, in the form of sensor housings and their components, as well as connecting or supporting bodies and pipes. Metal components are, especially, suitable for heat management (cooling or heating of components), wherein a good thermal contact to a metallic heat source or heat sink can be achieved via the connection to an integrated reactive material system. According to a further development of the present invention, metallic materials are, especially, steel, copper, aluminum, and various alloys. According to a further development of the invention, suitable plastics are, especially, PMMA, PTFE, PFA, PESU, and PEEK.

In a further development of the invention, the component arrangement according to the invention relates to a sensor of industrial process measurement technology, especially, a pressure sensor, a flow rate sensor, a density sensor, a viscosimeter, a level sensor, a temperature sensor, a potentiometric sensor, a coulometric sensor, an amperometric sensor, a conductivity sensor, a humidity sensor, or an optical sensor, wherein the first component is a first component of the sensor, and the second component is a second component of the sensor.

In a further development of the invention, one of the components comprises a light-emitting diode, a microelectromechanical system (MEMS), an acceleration sensor, an inclination sensor, humidity sensors, a micro-optical-electromechanical system (MOEMS), e.g., a micromirror, a microbolometer, or an optical switch.

The pressure transducer according to the invention comprises a component arrangement according to the invention in accordance with one of the preceding claims, wherein the pressure transducer comprises a measuring diaphragm, which can be loaded with a pressure, and at least one counter body, wherein the counter body supports the measuring diaphragm along a circumferential edge, wherein the counter body is connected to a supporting body, wherein the pressure transducer comprises a component arrangement according to the invention, wherein the supporting body is a component of the component arrangement, which is connected to the other component by means of the integrated reactive material system.

In a further development of the invention, the counter body is the other component of the component arrangement, which is connected to the supporting body by means of the integrated reactive material system.

In a further development of the invention, the pressure transducer further comprises a metallic housing body or connecting body, wherein the housing body or connecting body is the other component of the component arrangement, which is connected to the supporting body by means of the integrated reactive material system.

In a further development of the invention, the supporting body comprises a channel, through which the measuring diaphragm can be loaded with a pressure, wherein the transducer further comprises a pressure supply line, which is connected to the supporting body in a pressure-tight manner, wherein the pressure supply line is a second component of the component arrangement, which is connected to the supporting body by means of the integrated reactive material system, wherein the pressure supply line communicates with the pressure channel.

The method according to the invention for producing at least one component arrangement, especially, a component arrangement according to the invention or a pressure transducer according to the invention, by connecting at least a first component to at least a second component, wherein the first component has a first joining surface, and wherein the second component has a second joining surface, wherein the first joining surface is to be connected to the second joining surface, comprises the following steps:

Preparing an integrated reactive material system on a surface of the first component in the region of a joining surface and a surface region adjoining the joining surface, wherein the integrated reactive material system forms an activation region on the adjoining surface region;

Positioning the second component with respect to the first component such that the second joining surface rests against the first joining surface, and the activation region is exposed;

Activating the integrated reactive material system, so that the integrated reactive material system performs an exothermic reaction, by means of which a joining material is fused between the first and second joining surface, whereby the first component is connected to the second component between the two joining surfaces.

In a further development of the invention, the preparation of the integrated reactive material system comprises the deposition of several alternating layers of at least two reactants on the first component.

In a further development of the invention, the second component is provided at least in the region of the second joining surface with a wetting layer, which, especially, contains gold, prior to positioning the second component with respect to the first component.

In a further development of the invention, at least one wafer, which contains several first components, is coated with the integrated reactive material system in the region of the first joining surfaces and the respectively adjoining surface regions.

In a further development of the invention, at least one recess adjoining the first joining surfaces respectively is prepared in a first surface of the wafer prior to the wafer being coated with the integrated reactive material system, wherein at least one boundary surface of the recess adjoining the first joining surface forms the surface region, on which the activation region is prepared.

In a further development of the invention, the first components are separated by preparing recesses, which are laterally aligned with the recesses of the first surface of the wafer, from a second surface of the wafer, which is facing away from the first surface. In one embodiment of this further development of the invention, the recesses are formed by etching, sawing, or milling, wherein the preparation of the recesses from the second surface of the wafer is performed only to the extent that a remaining thickness of the wafer material still remains between the individual first components, whereby a predetermined breaking point is formed between the components.

BRIEF DESCRIPTION OF THE DRAWINGS

The invention will now be explained on the basis of the exemplary embodiments shown in the drawings. Illustrated are.

DETAILED DISCUSSION IN CONJUNCTION WITH THE DRAWINGS

Figure 1:
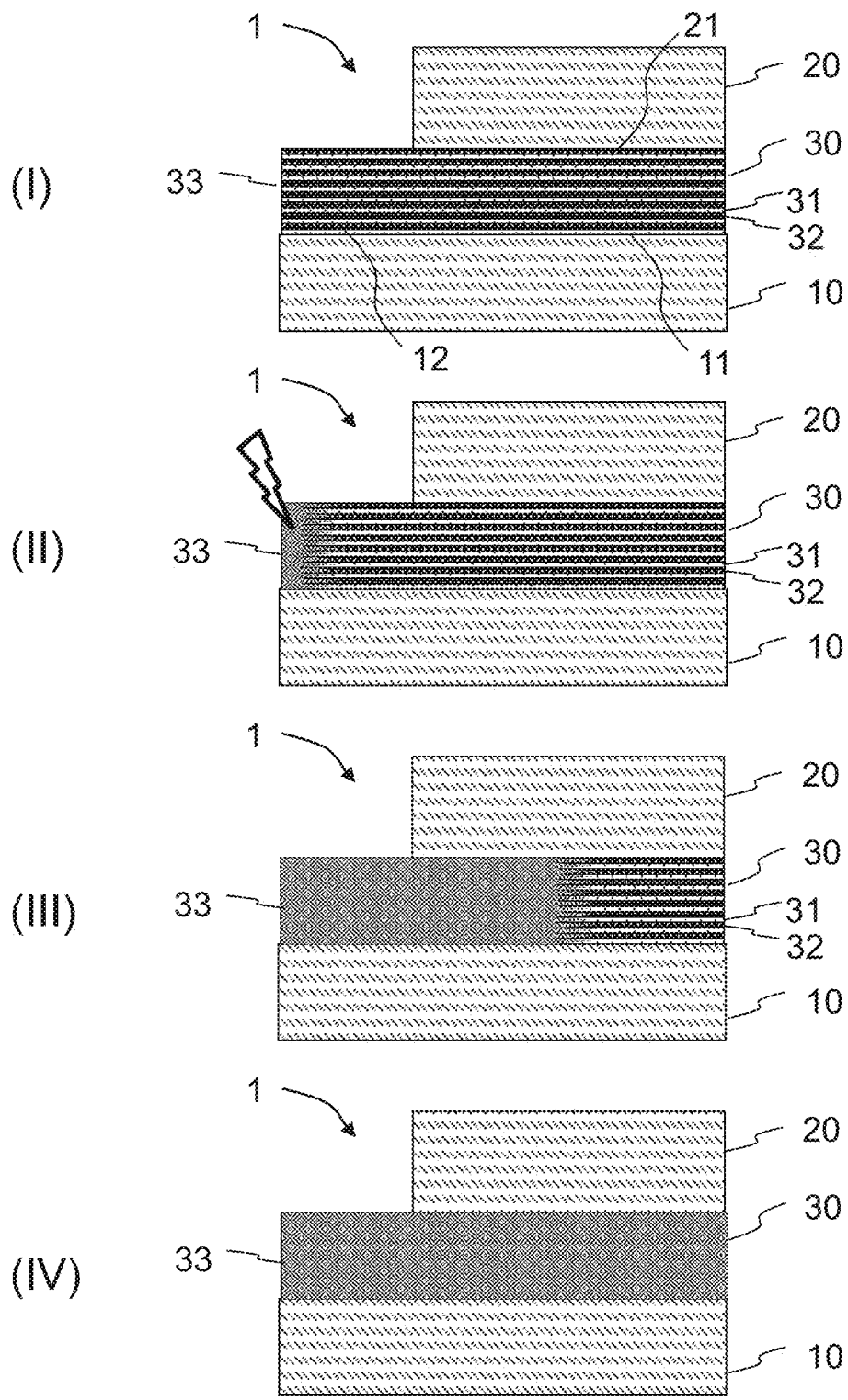
FIG. 1: is a schematic representation of a component arrangement according to the invention at different points in time during the joining of the components of the component arrangement.

The component arrangement illustrated in FIG. 1 comprises a first component 10 and a second component 20, which are joined together using an integrated reactive material system 30. For this purpose, a typical process flow for producing a joining connection by means of the exothermically reacting integrated material system is illustrated. The second component 20 is positioned in a first step(I) with a second joining surface 21 on a first joining surface 11 of the first component 10, wherein the first joining surface 11 of the first component 10 and an adjoining surface region 12 of the first component 10 are coated with an integrated reactive material system 30. The coating of the adjoining surface region forms an activation region, which is not covered by the second component 20. The reactive material system 30 comprises a layer sequence of alternating layers 31, 32 of two reactants, wherein the first reactant is, for example, Al, and wherein the second reactant is selected from the following materials: $CuO_x$, $Fe_2O_3$, Ni, Pd, Pt, or Zr. The respective layer thickness is approximately 20 nm and the total thickness of the layer sequence is approximately 1 μm. Preferably, the second component comprises a wetting layer made of gold, not shown separately here.

The first component 10 and the second component 20 can be both macroscopic and microscopic components, which contain glass, ceramics, metals, semiconductors, and/or plastics as materials.

In a second step (II), a force is applied to the components 10 and 20 in order to achieve a defined surface pressure between the joining surfaces 11, 21 of the components 10, 20, and an exothermic reaction is initiated outside the joining surfaces in the activation region of the integrated reactive material system. This initiation may take place electrically, thermally, electromagnetically, magnetically, mechanically, and/or via laser pulses. A great advantage of the invention is that, as a result of the provision of the activation region outside the space between the joining surfaces of the first and second component, the joining region between the joining surfaces must not be directly accessible for the initiation, and complex joining geometries, or joining geometries that are difficult to reach, can thus be produced. By initiating or activating an exothermic reaction between the layers 31, 32 of the integrated reactive material system 30, the layers are fused, such that interdiffusion between the layers occurs so that a mixed phase 33 is formed, by means of which the joining surfaces are joined. As shown in the images (III) and (IV)of FIG. 1, the exothermic reaction front runs through the entire integrated reactive material system, until it is completely converted by the reaction into the new mixed phase 33. In the process, the complete conversion is finished within a few milliseconds. Due to the low heat input, the joined components can be processed further immediately after the joining process.

The produced joining connection between the first and second components 10, 20 is preferably hermetically sealed, i.e., it has leakage rates of less than $1\times10^{-8}$ Pa m$^3$/L or $1\times10^{-8}$ mbar L/s. Furthermore, the joints are mechanically sturdy,with shear with shear strengths between 30 MPa and 400 MPa. They may be bio-compatible and/or resistant to aggressive media, e.g., oils or acids.

Figure 2:
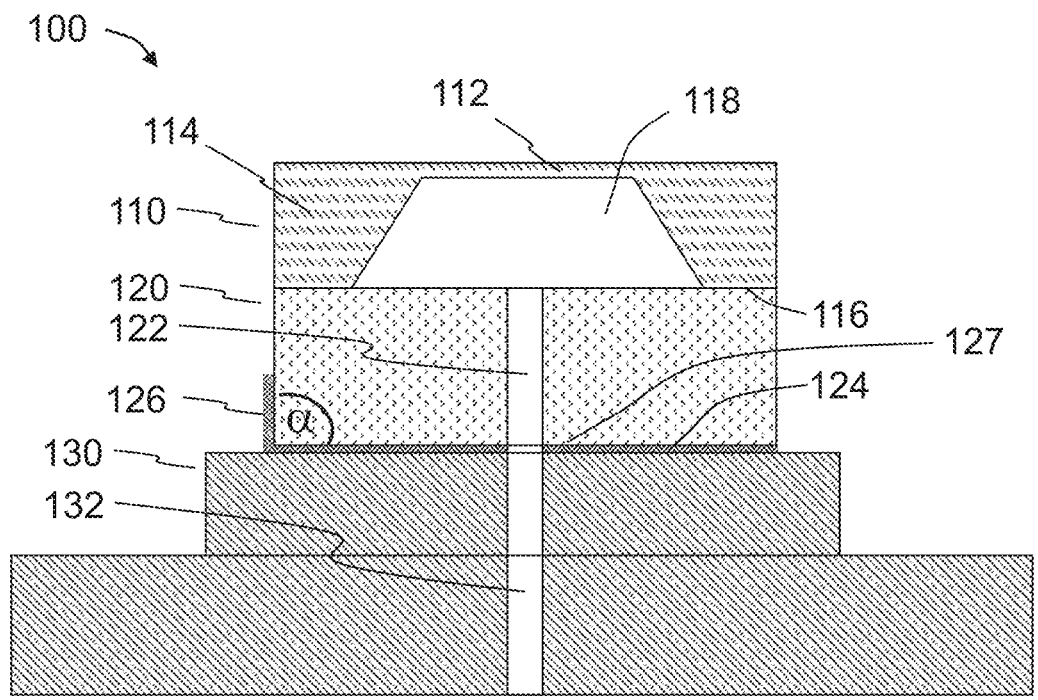
FIG. 2: is a schematic longitudinal view through a first exemplary embodiment of a pressure sensor according to the invention.

The pressure sensor 100 shown in FIG. 2 comprises a semiconductor pressure transducer 110 made of silicon, which comprises a measuring diaphragm 112 retained by a counter body 114. The measuring diaphragm 112 is formed by anisotropic etching of a measuring chamber 118 in a silicon wafer, wherein the edge region remaining around the measuring chamber 118 forms the counter body 114. The semiconductor pressure transducer 110 further comprises resistor elements, which are doped in the measuring diaphragm 112. The pressure sensor 100 moreover comprises a supporting body 120, which contains borosilicate glass, wherein the supporting body 120 is joined to a bottom side 116 of the counter body 114 by means of anodic bonding. Through the supporting body 120 extends a reference pressure channel 122, through which the measuring chamber 118 can be loaded with a reference pressure. On a bottom side of the supporting body 120 facing away from the pressure transducer 110, an integrated reactive material system 124 is prepared, which continues on a side of the supporting body 120, which extends orthogonally to the bottom side, in an activation region 126. The bottom side of the supporting body rests on a metallic base 130, wherein a channel 132 that communicates with the reference pressure channel 122 extends through the base 130, wherein the reactive material system 124 seals a reference pressure path, which is formed by the reference pressure channel 122 and the channel 132, with respect to the surroundings between the supporting body 120 and the base 130. The base 130 contains a metallic material—especially, Kovar. By activating the reactive material system in the activation region 126, an exothermic reaction is initiated, which completely converts the reactive material system 124 between the supporting body 120 and the base 130, whereby the two components are joined in a tight manner. Since the joining takes place without significant heating of the volumes of the base 130 and the supporting body 120, hardly any thermomechanical stresses were put on the components by the joining of the components to each other.

Figure 3:
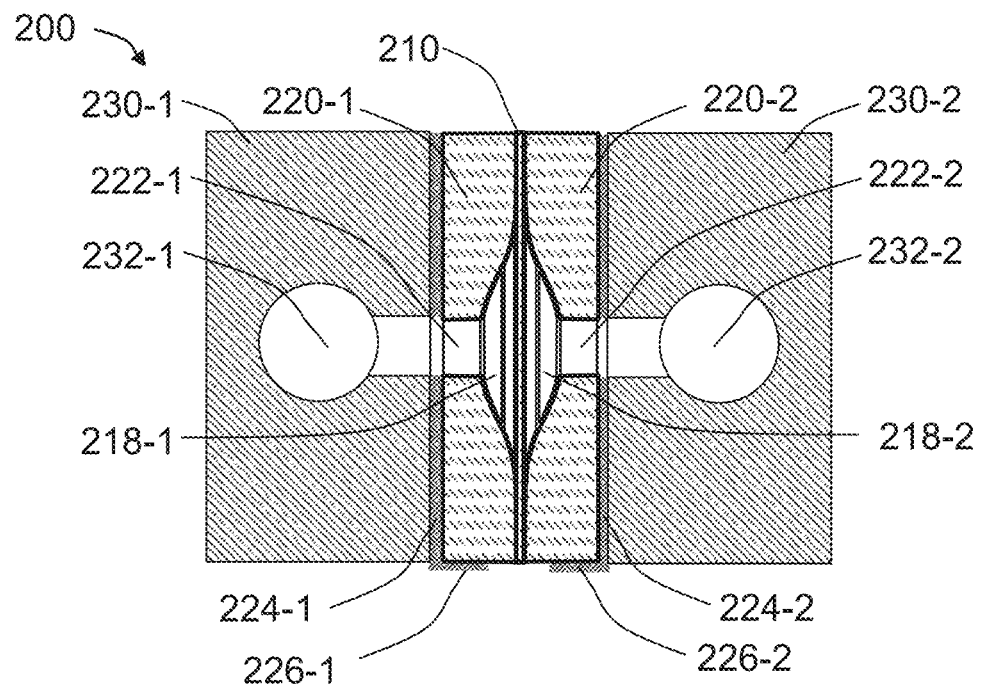
FIG. 3: is a schematic longitudinal view through a first exemplary embodiment of a pressure sensor according to the invention.

The exemplary embodiment of a pressure sensor shown in FIG. 3 comprises a differential pressure sensor 200 with a differential pressure transducer, which comprises a measuring diaphragm 210 made of silicon between a first counter body 220-1 and a second counter body 220-2. The two counter bodies respectively comprise a measuring chamber 218-1, 218-2, which is respectively delimited by a diaphragm bed, against which the measuring diaphragm 210 can rest in case of an overload. In addition, the counter bodies respectively comprise a pressure channel 222-1, 222-2, through which the measuring diaphragm 210 can be loaded with pressures acting against each other, so that the measuring diaphragm is moved as a function of the difference between the two pressures. In order to detect a pressure-dependent movement of the measuring diaphragm 210, the differential pressure transducer comprises at least one capacitive transducer, which comprises at least one electrode on a counter body and one electrode on the diaphragm side. The counter bodies 220-1, 220-2 contain silicon and are joined to the measuring diaphragm 210, which also contains silicon, by means of anodic bonding, wherein a silicon oxide layer is provided between the measuring diaphragm 210 and each of the counter bodies. The counter bodies 220-1, 220-2 are respectively supported on the rear side by a connecting body 230-1, 230-2, wherein through each connecting body extends a pressure line 232-1, 232-2, which communicates with the pressure channel 222-1, 222-2 of the adjoining counter body. The connecting bodies contain, especially, a ceramic material, the thermal expansion coefficient of which deviates by no more than 5 ppm/K from the thermal expansion coefficient of the material of the counter bodies. The joining surface of the counter bodies 220-1, 220-2 facing the supporting bodies is respectively coated with a reactive material system 224-1, 224-2, which respectively continues in an activation region 226-1, 226-2, which is arranged outside a joining surface between the counter bodies and the connecting bodies. The joining surfaces of the connecting bodies facing the counter bodies additionally comprise a wetting layer made of gold, not shown separately here. By activating an exothermic reaction in the activation regions 226-1, 226-2, the integrated reactive material systems 224-1, 224-2 between the counter bodies and the connecting bodies are completely converted in an exothermic reaction, whereby the counter bodies are respectively joined to the adjoining connecting body in a pressure-tight and pressure-retaining manner, wherein the converted reactive material systems at the same time seal the pressure paths that are formed by the pressure lines 232-1, 232-2 with the respectively adjoining pressure channels 222-1, 222-2. The pressure-resistant joint between the counter bodies and the connecting bodies stabilizes the differential pressure measuring cell against static overloads. In addition, compared to traditional soldering methods, the joining by means of an integrated reactive material system reduces the introduction of thermomechanical stresses in the joining partners. This significantly improves the measurement precision and the repeatability of the differential pressure sensor, since stress-related hysteresis effects are largely eliminated.

Figure 4:
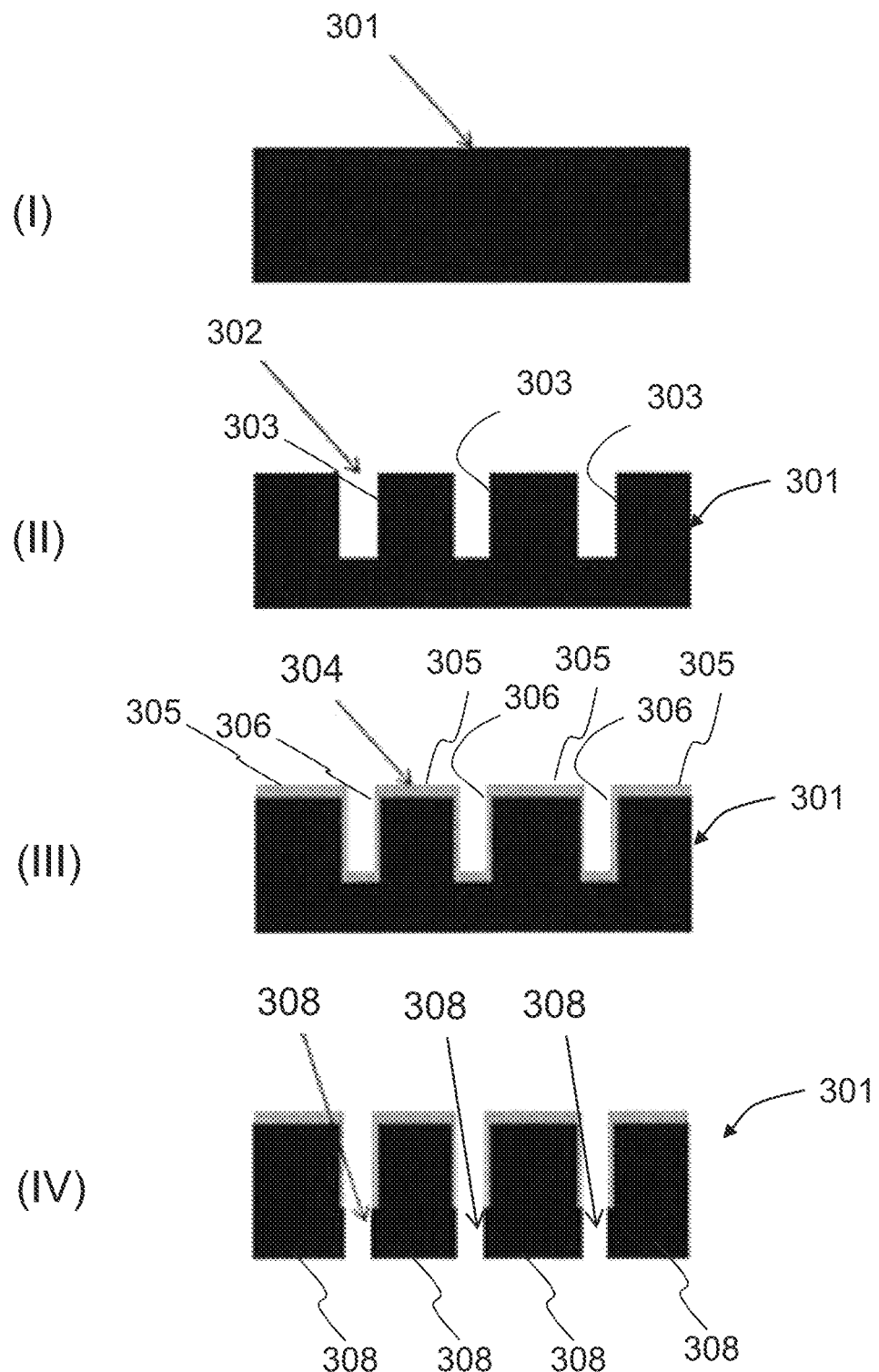
FIG. 4: shows the method steps during the preparation of components of the component arrangement according to the invention in the wafer composite.

FIG. 4 shows a sequence of method steps for depositing the integrated reactive material systems, including the subsequent isolation into separate components.

In a first step (I), the substrate 301 is provided and, if needed, a cleaning step is performed.

In a second step (II), the substrate 301 is structured, wherein component flanks 303 are formed, for example, by recesses 302 in one surface of the substrate 301. In the process, the structuring can be carried out, for example, by a sawing, etching, wet etching, dry etching, erosion or ablation process. Typically, such a component flank is structured, which is coated in the subsequent steps with the exothermically reacting integrated reactive materials.

In a third step (III), the structured substrates 301 are coated with the integrated reactive material system 304. For this purpose, the coating processes can be carried out by means of physical vapor deposition, electrochemical deposition, as well as deposition using printing techniques. The integrated reactive material system 301 comprises, on the one hand, a joining surface coating 305 on the upper side of the substrate and an activation region coating 306 on the previously structured flanks 303, wherein the joining surface coating 305 transitions into the activation region coating 306 so that a reaction of the joining surface coating can be activated by a reaction of the activation region coating.

In a fourth step (IV), the substrates 301 are separated into individual components (308). For this purpose, the separation may be carried out, for example, by a sawing, etching, wet etching, dry etching, erosion, or ablation process, especially, also from the bottom side of the substrate.

The invention claimed is:

1. A component arrangement, comprising:
a first component, which has a first joining surface;
a second component, which has a second joining surface; and
an integrated reactive material system, wherein:
said first joining surface is connected to said second joining surface at connected regions of the first and second joining surfaces using said integrated reactive material system;
said integrated reactive material system comprises at least one coating of at least one of said first and second joining surfaces;
said integrated reactive material system further comprises a surface having an activation region thereon; and
said activation region is arranged outside of said first or said second joining surface regions which are joined together, and adjoins the connected regions,
wherein the surface having the activation region thereon is tilted with respect to a plane, which is defined by the connected regions of the first and second joining surfaces, by an angle α, which is not less than 45°.

2. The component arrangement according to claim 1, wherein:
said integrated reactive material system comprises at least one alternating layer sequence selected from the following material combinations:
Al, in combination with one of the following materials CuOx, Fe2O3, Ni, Pd, Pt, and Zr; and/or
Ti, in combination with B, or Si; and/or
Zr, Ni, or Pd, in combination with Si; and/or
Pd or Pt, in combination with Sn or Zn.

3. The component arrangement according to claim 1, wherein:
a first of the first and second joining surfaces for joining the components is coated with said integrated reactive material system; and
a second of the first and second joining surfaces comprises a wetting layer, which, especially, contains gold.

4. The component arrangement according to claim 1, wherein:
at least one of the first and second components contains glass or a semiconductor as a material.

5. The component arrangement according to claim 1, wherein said angle α is not less than 60°.

6. The component arrangement according to claim 1, wherein said angle α is not less than 80°.

* * * * *